Oct. 5, 1965 J. C. BRIXEY, JR 3,210,225

METHOD OF MAKING TRANSISTOR

Filed Aug. 18, 1961 2 Sheets-Sheet 1

JOHN C. BRIXEY, JR.
INVENTOR.

BY John G. Graham

METHOD OF MAKING TRANSISTOR

Filed Aug. 18, 1961 2 Sheets-Sheet 2

JOHN C. BRIXEY, JR.
INVENTOR.

BY John G. Graham

United States Patent Office 3,210,225

Patented Oct. 5, 1965

3,210,225
METHOD OF MAKING TRANSISTOR

John C. Brixey, Jr., Richardson, Tex., assignor to Texas Instruments Incorporated, Dallas, Tex., a corporation of Delaware Filed Aug. 18, 1961, Ser. No. 132,439
2 Claims. (Cl. 148—187)

This invention relates to transistors and the method of making same. More specifically the invention relates to a method of fabricating diffused-base, diffused-emitter germanium transistors, and to transistors made by the practice of the method.

The broad idea of making diffused-base, diffused-emitter silicon transistors by diffusing one conductivity type determining impurity into a silicon body to form therein a base region and subsequently diffusing an opposite conductivity type determining impurity into the body to form therein an emitter region is well known. This method, however, has little or no application to the production of diffused-base, diffused-emitter germanium transistors, since the diffusion rates of impurities in germanium are very different from the diffusion rates of the same impurities in silicon.

Since the forming of base and emitter regions of transistors by diffusion methods provide numerous advantages over the methods of forming these regions by growing them or alloying them, for example by exercising closer control of these regions during the formation thereof, it is desirable to devise some operative methods for making a diffused-base, diffused-emitter germanium transistor. The present invention provides a novel method for so doing, the resulting germanium transistor structures made by this novel mode of fabrication themselves being novel.

It is therefore a principal object of this invention to provide a diffused-base, diffused-emitter germanium transistor and the method for making same.

Another object is to provide a diffused-base, diffused-emitter PNP germanium transistor and the method for making same.

A feature of this invention resides in the novel method of diffusing impurities into a semiconductor body to form the base and emitter regions of a transistor.

Some of the other features of this invention reside in the novel transistor structures resulting from the mode of fabrication according to the invention.

Figure 1A:
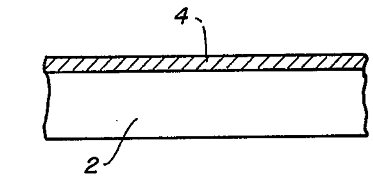
Figure 1B:
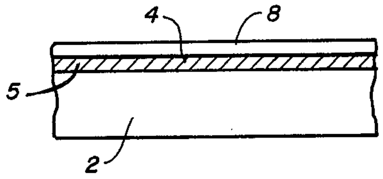
Figure 1C:
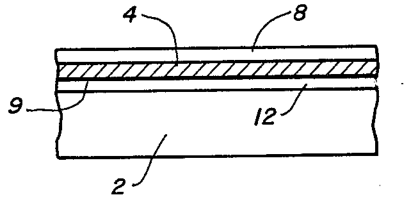
Figure 1D:
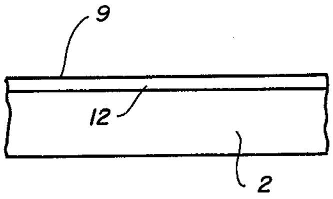
Figure 1E:
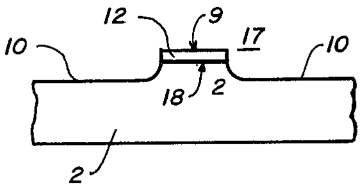
Figure 1F:
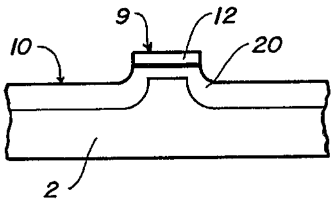
Figure 1G:
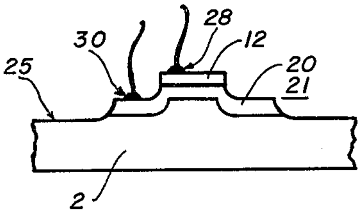
Figure 2A:
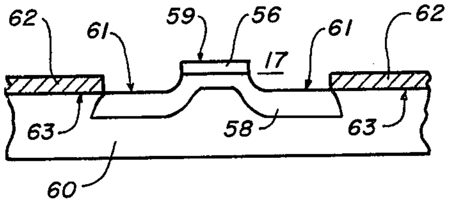
Figure 2B:
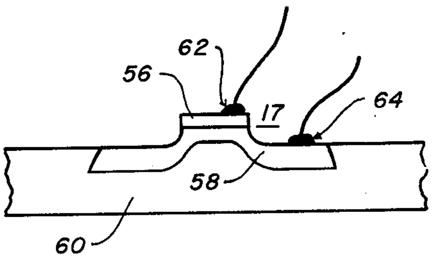

Other objects, advantages and features of this invention will become apparent from the following detailed descriptions, used as illustrative examples, when taken in connection with the appended claims and the accompanying drawing, in which like numerals refer to like parts, and in which:

FIGURE 1*a* through 1*g* show sectional views of a germanium wafer corresponding with the steps of fabricating a PNP germanium transistor according to the invention; and FIGURES 2*a* and 2*b* are sectional views illustrating two of the steps of fabricating another embodiment of the present invention.

Figure 3:
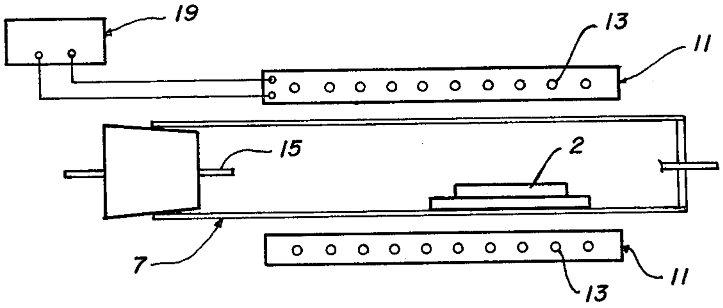

FIGURE 3 shown in conventional form the well-known reactive chamber.

A diffused region of a transistor is one that results from the diffusion of a conductivity type determining impurity into a region of a semiconductor body to alter either the original conductivity or conductivity type, or both, of that region. Thus a diffused-base, diffused-emitter transistor is one whose base and emitter regions are formed by diffusing conductivity type determining impurities into regions of a semiconductor body.

According to the invention a region of a germanium body, the germanium body having a given conductivity type and resistivity, is subjected to the diffusion therein of an impurity of the same conductivity type as that of the body to alter the conductivity, but not the conductivity type, of that region. The resultant conductivity of the region formed by the diffusion is higher than the conductivity of the original germanium body, thus distinguishing this region from the undiffused portion of the body. This region, or a portion thereof, constitutes what is known as the emitter of the transistor. The germanium body is also subjected to the diffusion therein of an impurity of the opposite conductivity type as that of the body, at least a portion of this impurity being diffused through the emitter region of the body. The latter impurity diffuses further into the original germanium body than the former impurity and is effective in forming a region below the emitter region of conductivity type opposite thereto, this opposite type region being utilized as the base of the transistor. In order to accomplish this, the latter impurity must have a greater diffusion rate in germanium than the impurity used to form the emitter region. Furthermore, it is desirable that there exist a high specific concentration of the former impurity in the emitter region in order to yield a high emitter efficiency. Moreover, the higher the concentration of impurity in the emitter region the less will be the effect on the conductivity of that region as a result of the diffusion of the latter impurity therethrough. By forming the emitter region of the transistor and thereafter forming a base region according to the foregoing method, the fabrication of a diffused-base, diffused-emitter germanium transistor is possible, as more fully described in the following illustrative examples.

Referring now to FIGURES 1*a* through 1*g*, there is shown the sectional views of a germanium wafer corresponding to the fabrication steps of a diffused-base, diffused-emitter germanium transistor. In FIGURE 1*a* there is shown a germanium slice 2 of P-type conductivity and having an electrical resistivity of about 0.2 ohm-centimeter. A layer 4 of silicon dioxide is provided on a surface of germanium wafer 2 by a method that is fully described in copending application by K. E. Statham, Serial No. 94,244, filed March 8, 1961, the method involving a pyrolytic decomposition of a silicon-organic compound in the presence of the wafer 2, the temperature of the wafer being elevated during this process. The thickness of layer 4 is not critical but preferably is about 8000 angstrom units.

A thin layer 8 of an alloy containing a P-type conductivity determining impurity is deposited on the surface of the silicon dioxide layer 4, as shown in FIGURE 1*b*. The copending application of R. E. Anderson, Serial No. 65,228, filed October 26, 1960, more fully describes the reasons for diffusing an impurity into the wafer 2 from an alloy source that covers the entire surface area of the region to be diffused. Briefly, an infinite source of any desired concentration of an impurity can be achieved in this manner. Moreover, since in one example gallium is the impurity to be diffused, it is instructive to point out that the diffusion of gallium can be easily controlled where the gallium source is in the form of an alloy layer adjacent the semiconductor body.

As one example, a gallium-germanium alloy layer 8 of thickness of about 20,000 to 30,000 angstrom units is provided on the surface 5 of the silicon dioxide layer 4 (see FIGURE 1*b*). Any suitable method of uniformly depositing an alloy layer onto the surface of a semiconductor wafer may be utilized to effect the gallium-germanium alloy layer 8 on the silicon dioxide layer 4. A preferred method of so doing is to vaporize an amount of gallium-germanium alloy in the presence of germanium wafer 2. This can be accomplished in an evaporator, the vaporization preferably being carried out under evacuated conditions. In this manner the uniformity and purity of layer 8 is assured.

After the gallium-germanium alloy layer 8 is deposited on the surface of silicon dioxide layer, it is placed in a quartz tube 7 (see FIGURE 3), said tube 7 being within the cylindrical furnace 11 and heated to a temperature of from about 700° C. to about 925° C. in the presence of hydrogen, the heat being supplied by coils 13 furnished with electric current from power source 19. An inlet 15 is provided so that hydrogen may be passed over the surface of wafer 2 during the heating process. Heating the wafer to 868° C. in the presence of hydrogen for one hour is suitable for diffusing some of the gallium in the gallium-germanium alloy layer 8 into the silicon dioxide layer 4 and the adjacent region 12 of the germanium wafer 2, the gallium readily diffusing through the silicon dioxide layer 4 as shown in FIGURE 1*c*. For the given temperature and diffusion time, the depth of the diffused gallium in the wafer 2 from the surface 9 is about .06 to .07 mil. The silicon dioxide layer 4 has the specific purpose of preventing the gallium in the gallium-germanium alloy from alloying with the surface 9 of the germanium wafer 2 during the process of evaporating the layer 8 onto the wafer and during the diffusion of the gallium therein. Although the presence of the silicon dioxide layer 4 is not absolutely necessary for the method to be operative, it is preferable to include it for the above-noted reasons.

It is possible to use sources other than the alloy layer 8 for the gallium diffusion, but the gallium-germanium alloy is preferred to provide a more uniform diffusion. For example, other gallium diffusions have been made using pure gallium vapor, or by reducing the vapor of gallium trioxide in the presence of the wafer 2 at elevated temperatures.

The solubility of gallium in germanium is relatively high and is approximately $10^{20}$ gallium atoms per cubic centimeter of germanium. Because of this high solubility and because the gallium is a P-type conductivity determining impurity in germanium, the diffused region 12, as shown in FIGURE 1*c*, will have a much higher concentration of P-type impurities than the undiffused portion of the original germanium wafer 2, the undiffused portion having a P-type impurity concentration of about $10^{16}$ to $10^{17}$ impurities per cubic centimeter. Therefore, the P-type region 12 will hereinafter be referred to as a p+ region, the "plus" sign denoting a very high concentration of impurity.

The gallium-germanium alloy layer 8 and silicon dioxide layer 4 are now removed, as indicated in FIGURE 1*d*, by etching the wafer 2 with, for example, hydrofluoric acid or some mixture containing hydrofluoric acid. The etching material will not affect the germanium wafer 2.

Kodak Metal Etch Resist (KMER), a product of the Eastman Kodak Co., is applied as a thin coating to all surfaces of wafer 2. A portion of the wafer surface 9 is appropriately masked and the unmasked portion of surface 9 is exposed to light. The wafer 2 is then immersed in a developer, the exposed portion being developed (becomes a hardened coating) and the unexposed portion of the KMER being washed away during the developing process. The configuration of the mask used to expose portions of the wafer surface 9 is immaterial to the present invention and any mask design may be used. After the developing process is completed the wafer 2 is etched with any suitable germanium etch, for example, hydrogen peroxide and hydrofluoric acid, to remove most of the p+ region 12, the wafer not being attacked by the etch in the areas covered by the developed KMER. This leaves a projection 17, commonly called a mesa, from the newly formed wafer surface 10, the projection containing the entire remaining p+ region 12 that is not etched away, as illustrated in FIGURE 1*e*. In this manner, the area of the junction 18 between p+ region 12 and the undiffused portion of the P-type germanium wafer 2 as shown in FIGURE 1*d* is reduced to the profile shown in FIGURE 1*e*. The developed KMER on the surface of wafer 2 is then removed with a solvent such as trichloroethylene.

The wafer 2 is now placed in one end of a quartz tube essentially the same as the one shown in FIGURE 3 and an N-type conductivity determining impurity source (not shown) is placed in the tube in spaced relation with wafer 2 between the inlet 15 and the wafer. For example, antimony is a preferred N-type conductivity determining impurity in germanium and an appropriate supply thereof is placed in the tube with the wafer, the antimony being in granular form of high purity. The wafer is now heated to a temperature from about 700° C. to about 900° C., and the antimony source is heated from about 400° C. to about 450° C. Heating the wafer 2 to a temperature of about 760° C. and heating the antimony source to a temperature of about 430° C. in the presence of hydrogen flowing at the rate of from .5–2.0 l./min. for a time of about 30 minutes, is suitable for diffusing the antimony into the germanium wafer 2 to a depth of about .09 mil from the surfaces 9 and 10 respectively of the wafer 2, as indicated in FIGURE 1*f*.

The diffusion rate of antimony in germanium is very high as compared to the diffusion rate of gallium in germanium. Therefore, the antimony diffuses rapidly through the p+ region 12 and into the interior of the semiconductor wafer 2, thus forming therein an N-type conductivity region designated by the numeral 20, as indicated in FIGURE 1*f*. The maximum solubility of antimony in germanium is approximately $10^{19}$ antimony atoms per cubic centimeter of germanium. Thus the maximum concentration of antimony atoms at the surfaces 9 and 10 of the germanium wafer 2 during the diffusion process is about $10^{19}$ atoms/cc. The concentration of the antimony at a small distance below the wafer surface 9 is as little as $10^{18}$ antimony atoms per cubic centimeter or less. Therefore, the impurity concentration of antimony in the germanium wafer 2 is about two orders of magnitude less than the concentration of the gallium in the germanium. Because of the high diffusion rate of antimony in germanium, the antimony penetrates much further into the germanium wafer than the gallium. The antimony will not appreciably affect the conductivity of the p+ region 12 because the conductivity of region 12 is determined almost exclusively by the gallium concentration therein.

In the same manner as described for etching the first mesa 17, a second mesa 21 is etched to reduce the junction area between N-type region 20 and the undiffused portion of germanium wafer 2, as illustrated in FIGURE 1*g*. It will be apparent to those skilled in the transistor art that many reasons exist for reducing this area. For example, reduction of the capacitance of the transistor and the prevention of shorting out the device during soldering operations can be achieved by etching of the second mesa. The remaining N-type region 20, as shown in FIGURE 1*g* is completely contained within the mesa 21 from the surface 25 of the germanium wafer 2, newly formed by the previous etching process. Moreover, both the region 12 and region 20 are completely contained above the surface 25. The undiffused portion of germanium wafer 2 acts as the collector region of the transistor, the N-type region 20 formed by the antimony diffusion acts as the base region, and the smaller p+ region 12 acts as the emitter region. Ohmic contacts 28 and 30 to the emitter and base region, respectively, can be provided by any suitable means, these means being well known in the art and not herein described. Likewise a suitable ohmic contact (not shown) to the collector region of the transistor is provided by soldering or welding the wafer 2 to a transistor header.

The transistor device as shown in FIGURE 1*g* has many of the advantages of diffused-emitter, diffused-base silicon transistors. Because of the elevation of the base region 20 and emitter region 12 from the surface 25 of the germanium wafer 2, as shown in FIGURE 1*g*, it is apparent that both the emitter region 12 and the base region 20 are accessible for electrical contacting purposes.

Referring now to FIGURES 2*a* and 2*b*, a second embodiment of the present invention is therein illustrated. To facilitate the description of the process for making the device as shown in FIGURES 2*a* and 2*b*, the initial steps of fabrication are the same as those described with reference to FIGURES 1*a* through 1*e*. After the mesa 17 has been etched as described with reference to FIGURE 1*e*, a silicon dioxide layer 62 is formed on the surfaces 63 of the germanium wafer 60, as shown in FIGURE 2*a*. Layer 62 is formed by the method described in the abovenoted Statham copending application. Reference to FIGURE 2*a* shows that a portion of the silicon dioxide layer has been selectively removed from the surface 59 of mesa 17 and surface 61 of the wafer 60 by the same process as heretofore described, that is, by using KMER and etching, thus exposing the mesa 17 and surface 61.

An N-type impurity diffusion is now effected by placing the wafer 60 in a quartz tube essentially the source as the one illustrated in FIGURE 3. For example, antimony is diffused into the exposed surfaces 59 and 61 of germanium wafer 2 in essentially the same manner as described with reference to FIGURE 1*f*. Since silicon dioxide is effective as a mask against the diffusion of antimony therethrough, an N-type conductivity region 58 is formed and limited to the area exposed by surfaces 59 and 61 as shown in FIGURE 2*a*. The area of the junction between region 58 and the undiffused portion of wafer 60 does not extend throughout the entire area of wafer 60, thus eliminating the necessity of reducing the area of region 58 by etching a second mesa as described with reference to FIGURE 1*f*. It will be appreciated that, as an alternate to the silicon dioxide layer 62, some other suitable mask could be used such as a metal mask. In either case, the mask surrounds the emitter region 56, leaving some of the surface of the germanium wafer 60 exposed.

After the antimony diffusion, the silicon dioxide mask 62 can be removed, as shown in FIGURE 2*b*, by etching the wafer 60 with hydrofluoric acid or some suitable mixture containing hydrofluoric acid, or alternatively, the silicon dioxide layer 62 can be left on the surface 63 of wafer 60 to permanently protect the junction between region 58 and wafer 60.

The restriction of the diffusion of the antimony to the region 58 makes it unnecessary to cut a second mesa as described with reference to the first embodiment shown in FIGURE 1*e*, because the area of the junction between region 58 and the undiffused portion of wafer 60 is restricted to the desired dimensions. Moreover, because the area of the region 58 is greater than the area of region 56, region 58 is accessible for purposes of electrical contacting, as shown in FIGURE 2*b*. Suitable electrical contacts 65 and 64 to regions 56 and 58 respectively are provided as shown in FIGURE 2*b*.

Although the present invention has been described with reference to specific examples, many modifications and substitutions can be made without departing from the scope of the invention. For example, different N-type and P-type impurities can be used for forming the base and emitter regions although preferred dopants have been specified. And different transistor structures can be made while still utilizing the method as provided by the present invention. Thus the scope of the invention is limited only by the appended claims.

What is claimed is:

1. A method of making a PNP germanium transistor comprising the steps of:

(a) forming a layer of silicon dioxide over a surface of a P-type germanium body;

(b) diffusing a P-type impurity having high solubility and slow diffusion rate into said surface of the body through said layer to form a first region of increased conductivity;

(c) reducing the area of the junction between said first region and the undiffused portion of said body by etching away a portion of said first region to form a mesa;

(d) forming a second region by diffusing an N-type impurity having a faster diffusion rate than said P-type impurity but having a lower solubility through said first region into said body and into the portion of the body exposed by etching away a portion of said first region; and (e) reducing the area of the junction between said second region and the undiffused portion of said body by etching away a part of said second region to form a stepped mesa structure.

2. In the method of making a PNP germanium transistor, the steps of depositing a layer of an oxide of silicon on a surface of a P-type germanium body, depositing a layer of the alloy of gallium and germanium on the surface of said layer of an oxide of silicon, heating said body to diffuse a portion of the gallium in said layer of alloy into said body to form therein a first region of increased electrical conductivity, removing said layer of alloy and said layer of oxide, reducing the area of the junction between said first region and the undiffused portion of said body by etching away a portion of said first region, diffusing antimony into said body to form an N-type region in said body which is intermediate to and contiguous with said first region and the undiffused portion of said body, and reducing the area of the junction between said N-type region and the undiffused portion of said body.

References Cited by the Examiner

UNITED STATES PATENTS

| | | | |
|---|---|---|---|
| 2,802,760 | 8/57 | Derick et al. | 148—1.5 |
| 2,840,497 | 6/58 | Longini | 148—1.5 |
| 2,861,018 | 11/58 | Fuller et al. | 148—189 |
| 2,966,720 | 1/61 | Cornelsion et al. | |
| 2,978,617 | 4/61 | Dorendorf | 148—1.5 X |
| 2,978,661 | 4/61 | Miller et al. | 148—1.5 X |
| 3,040,219 | 6/62 | Fulop | 148—1.5 X |
| 3,055,776 | 9/62 | Stevenson et al. | 148—1.5 X |

FOREIGN PATENTS

| | | |
|---|---|---|
| 846,720 | 8/60 | Great Britain. |

BENJAMIN HENKIN, *Primary Examiner.*

DAVID L. RECK, *Examiner.*